(12) United States Patent
Reddington et al.

(10) Patent No.: US 8,337,688 B2
(45) Date of Patent: Dec. 25, 2012

(54) METAL PLATING COMPOSITIONS

(75) Inventors: Erik Reddington, Ashland, MA (US); Gonzalo U. Desmaison, Berlin (DE); Zukra I. Niazimbetova, Westborough, MA (US); Donald E. Cleary, Littleton, MA (US); Mark Lefebvre, Hudson, NH (US)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 0 days.

(21) Appl. No.: 13/209,592

(22) Filed: Aug. 15, 2011

(65) Prior Publication Data

US 2012/0034371 A1 Feb. 9, 2012

Related U.S. Application Data

(62) Division of application No. 12/080,484, filed on Apr. 2, 2008, now Pat. No. 8,048,284.

(60) Provisional application No. 60/921,660, filed on Apr. 3, 2007.

(51) Int. Cl.
| | |
|---|---|
| C25D 3/56 | (2006.01) |
| C25D 3/58 | (2006.01) |
| C25D 3/62 | (2006.01) |
| C25D 3/60 | (2006.01) |
| C25D 3/46 | (2006.01) |
| C25D 3/50 | (2006.01) |
| C25D 3/48 | (2006.01) |
| C25D 3/12 | (2006.01) |
| C25D 3/38 | (2006.01) |
| C25D 3/30 | (2006.01) |
| C25D 3/32 | (2006.01) |

(52) U.S. Cl. ........ 205/238; 205/239; 205/241; 205/242; 205/247; 205/251; 205/252; 205/253; 205/255; 205/257; 205/259; 205/261; 205/263; 205/264; 205/265; 205/266; 205/267; 205/271; 205/291; 205/296; 205/300; 205/302; 205/303

(58) Field of Classification Search ............... 427/430.1; 205/238–315
See application file for complete search history.

(56) References Cited

U.S. PATENT DOCUMENTS

| | | | |
|---|---|---|---|
| 2,752,312 A | 6/1956 | Dixon | |
| 3,160,611 A | 12/1964 | Runge | |
| 4,452,922 A | 6/1984 | Speranza et al. | |
| 6,425,996 B1 * | 7/2002 | Dahms et al. | 205/298 |
| 2003/0226758 A1 | 12/2003 | Egli | |
| 2006/0065536 A1 | 3/2006 | Jentz et al. | |
| 2007/0120910 A1 * | 5/2007 | Odell et al. | 347/88 |
| 2007/0123606 A1 * | 5/2007 | Toma et al. | 523/160 |

FOREIGN PATENT DOCUMENTS

| | | |
|---|---|---|
| AU | 40321 | 9/1973 |
| EP | 0 770 711 | 5/2001 |
| JP | 52130436 A * | 11/1977 |
| WO | WO 2004/100904 A1 | 11/2004 |

OTHER PUBLICATIONS

European Search Report of corresponding European Application No. 08 25 1284, Nov. 7, 2008.

* cited by examiner

Primary Examiner — Edna Wong
(74) Attorney, Agent, or Firm — John J. Piskorski

(57) ABSTRACT

Disclosed are metal plating compositions for plating a metal on a substrate. The metal plating compositions include compounds which influence the leveling and throwing performance of the metal plating compositions. Also disclosed are methods of depositing metals on a substrate.

5 Claims, No Drawings

METAL PLATING COMPOSITIONS

This application is a Divisional of U.S. Non-Provisional application Ser. No. 12/080,484, filed Apr. 2, 2008, now U.S. Pat. No. 8,048,284, which application claims the benefit of priority under 35 U.S.C. §119(e) to U.S. Provisional Application No. 60/921,660, filed Apr. 3, 2007, the entire contents of which application are incorporated herein by reference.

The present invention is directed to metal plating compositions. More specifically, the present invention is directed to metal plating compositions containing compounds which influence leveling performance and throwing power of metal plated deposits.

Metal plating is a complex process that involves multiple ingredients in a plating composition. In addition to metal salts, other components include additives to increase the ionic conductivity of the solution, to control the pH of the plating composition, to improve the brightness, ductility, and uniform plating distribution of the metal deposit, ductility, uniform distribution of the metal deposit, and increase the throwing power. Such additives may include inorganic acids, halogens, pH adjusters, surfactants, brighteners, carriers and levelers.

Uniform distribution of a metal on a substrate is necessary, such as in the metallization of printed wiring boards which has a surface as well as a large number of small through-holes and blind vias. If only a very thin layer of metal is deposited in these through-holes and vias, it may tear under thermal or mechanical stress, for example during soldering, such that the passage of current is interrupted. Printed wiring boards damaged in this way are unacceptable for commercial use. Since printed wiring boards with smaller and smaller hole diameters are being manufactured, for example 0.25 mm and smaller, it becomes more and more difficult to electroplate an evenly distributed layer of metal into the through-holes. It has been observed that metal layer thickness can be unsatisfactory in many printed wiring boards, particularly in holes with small diameters. Achieving a bright metal layer of uniform thickness with high thermal reliability can be challenging for many printed circuit board designs.

Many plating formulations use a chemical solution to address the problem of non-uniform plating by adding levelers to the plating bath. Various compounds have been used with varying performance An example of one type of leveler used in copper plating baths are the transformation products formed from epihalohydrins, dihalohydrins or 1-halogen-2, 3-propandiols and polyamidoamines as disclosed in U.S. Pat. No. 6,425,996. Another example of levelers are those disclosed in Japanese patent S63-52120. These levelers are ethoxylated dicarboxylic acids and ethoxylated diamines While the compounds disclosed in these two patents allegedly have acceptable leveling performance, there is still a need for metal plating compositions having improved leveling performance and improved throwing power.

In one aspect compositions include one or more sources of metal ions and one or more compounds having a formula:

(I)

where A is —NH—; or —NH—$R_6$—;
$R_1$ is random, alternating or block —(CHR$_9$CHR$_{10}$O)$_p$—H, where
$R_9$ and $R_{10}$ are the same or different and are —H, —CH$_3$, or —CH$_2$CH$_3$ and
p is an integer from 1 to 50;
$R_2$ is random, alternating or block —(CHR$_9$CHR$_{10}$O)$_p$—H; or —C(O)—$R_5$—C(O)—OH;
$R_3$ is —(CH$_2$)$_r$—NH—$R_4$—(CH$_2$)$_r$—; —(CH$_2$)$_r$—NH—(CH$_2$)$_r$—; —(CH$_2$)$_r$—(OC$_2$H$_4$)—O—(CH$_2$)$_r$—; or —(CH$_2$)$_r$— and r is an integer from 1 to 8;
$R_4$ is random, alternating or block —(CHR$_9$CHR$_{10}$O)$_p$—;
$R_5$ is —(CH$_2$)$_q$— where q is an integer from 1 to 8;
$R_6$ is random, alternating or block —(CHR$_9$CHR$_{10}$O)$_p$—; and
n is an integer of 1 to 10.

Such compounds improve the performance of the metal plating compositions, such as leveling and throwing power.

In another aspect methods include providing a composition including one or more sources of metal ions and one or more compounds having a formula:

(I)

where A is —NH—; or —NH—$R_6$—;
$R_1$ is random, alternating or block —(CHR$_9$CHR$_{10}$O)$_p$—H, where
$R_9$ and $R_{10}$ are the same or different and are —H, —CH$_3$, or —CH$_2$CH$_3$ and
p is an integer from 1 to 50;
$R_2$ is random, alternating or block —(CHR$_9$CHR$_{10}$O)$_p$—H; or —C(O)—$R_5$—C(O)—OH;
$R_3$ is —(CH$_2$)$_r$—NH—$R_4$—(CH$_2$)$_r$—; —(CH$_2$)$_r$—NH—(CH$_2$)$_r$—; —(CH$_2$)$_r$—(OC$_2$H$_4$)—O—(CH$_2$)$_r$—; or —(CH$_2$)$_r$—and
r is an integer from 1 to 8;
$R_4$ is random, alternating or block —(CHR$_9$CHR$_{10}$O)$_p$—;
$R_5$ is —(CH$_2$)$_q$— where q is an integer from 1 to 8;
$R_6$ is random, alternating or block —(CHR$_9$CHR$_{10}$O)$_p$—; and n is an inter of 1 to 10;
contacting a substrate with the composition; and plating the substrate with a metal.

The metal plating compositions may be used in any industry where metal plating is done. For example, the metal plating compositions may be used in the manufacture of electrical devices, such as printed wiring boards, in general, through-holes, vias, integrated circuits, electrical contact surfaces and connectors, electrolytic foil, silicon wafers for microchip applications, semi-conductors and semi-conductor packaging, lead frames, optoelectronic devices, optoelectronic packaging, solar panels and solder bumps. The metal plating compositions also may be used for metal plating decorative articles, such as jewelry, furniture fittings, automobile parts and sanitary appliances.

As used throughout this specification, the following abbreviations shall have the following meanings, unless the context indicates otherwise: ° C.=degrees Centigrade; g=gram; mg=milligrams; L=liter; ml=milliliter; dm=decimeter; A=amperes; mm=millimeters; cm=centimeters; ppb=parts per billion; ppm=parts per million; mil=0.001 inches; 2.54 cm=1 inch; wt %=percent by weight; NMR=nuclear magnetic resonance spectroscopy; and IR=infra-red spectroscopy. The term "throwing power"=the ratio of the thickness of the metal plated in the center of a through hole compared to the thickness of the metal plated at the surface. The term "random" means two or more distinct chemical groups are not arranged in a compound in any defined succession. The term "alternating" means two or more distinct chemical groups are arranged in succession in a compound. The term "block" means a distinct chemical group occurs in succession at least twice in a compound.

All percentages are by weight, unless otherwise noted. All numerical ranges are inclusive and combinable in any order, except where it is logical that such numerical ranges are constrained to add up to 100%.

The metal plating compositions include one or more compounds having a formula:

$$R_1\text{-}A\text{-}R_3\text{-}A\text{-}[C(O)\text{—}R_5\text{—}C(O)\text{-}A\text{-}R_3\text{-}A]_n\text{-}R_2 \quad (I)$$

where A is —NH—; or —NH—$R_6$—;
$R_1$ is random, alternating or block —$(CHR_9CHR_{10}O)_p$—H, where
$R_9$ and $R_{10}$ are the same or different and are —H, —$CH_3$, or —$CH_2CH_3$ and
p is an integer from 1 to 50 or such as 5 to 25;
$R_2$ is random, alternating or block —$(CHR_9CHR_{10}O)_p$—H; or —C(O)—$R_5$—C(O)—OH;
$R_3$ is —$(CH_2)_r$—NH—$R_4$—$(CH_2)_r$—; —$(CH_2)_r$—NH—$(CH_2)_r$—; —$(CH_2)_r$—$(OC_2H_4)$—O—$(CH_2)_r$—; or —$(CH_2)_r$— and
r is an integer from 1 to 8 or such as from 2 to 6;
$R_4$ is random, alternating or block —$(CHR_9CHR_{10}O)_p$—;
$R_5$ is —$(CH_2)_q$- where q is an integer from 1 to 8 or such as from 2 to 4;
$R_6$ is random, alternating or block —$(CHR_9CHR_{10}O)_p$—; and n is an integer of 1 to 10 or such as from 2 to 5.

Such compounds may be prepared using conventional methods known in the art and literature. Starting materials include, but are not limited to, diamines, triamines, dicarboxylic acids and alkylene oxides. One or more diamines or triamines may be reacted with one or more dicarboxylic acids in a conventional condensation polymerization reaction.

Known preparation methods may be used or adapted with minor experimentation to yield low molecular weight condensation polyamides which may be described as mixtures of polyamides, oligomides and amides. The procedures deliver soluble materials with low molecular weight and use the amine reactants in surplus and up to a ratio of less than or equal to 2 molar equivalents as related to 1 equivalent of carboxylic acid. The resulting amide is then reacted in a second condensation reaction with one or more alkylene oxides to provide the final alkoxylation or polyalkoxylation product of the polyamide substrate mixture.

The alkoxylation of polyamides is usually carried out by heating the polyamides in an excess of alkyleneoxide in a closed reactor at 80°-120° C. The alkyleneoxides have 2 to 4 carbon atoms. Typically, gaseous ethyleneoxide and liquid propyleneoxide are used. Alkyleneoxides are commercially available.

Diamines which may be used to make the amides include, but are not limited to, compounds having a formula:

$$H_2N\text{—}R_3\text{—}NH_2 \quad (II)$$

$R_3$ is —$(CH_2)_r$-A-$(CH_2)_r$—; —$(CH_2)_r$—$(OC_2H_4)$—O—$(CH_2)_r$—; or —$(CH_2)_r$— and
r is an integer from 1 to 8;
wherein the alkylene group may be substituted or unsubstituted. Substitutions include alkylene groups of 1 to 4 carbon atoms, typically —$CH_3$, $CH_2$—$CH_3$, more typically —$CH_3$. Examples of such compounds include, but are not limited to, hexamethylene diamine, 2-methyl pentamethylenediamine, 2-methyl hexamethylene diamine, 3-methyl hexamethylene diamine, 2,5-dimethyl hexamethylene diamine, 2,2-dimethylpentamethylene diamine, 5-methylnonane diamine, dodecamethylene diamine, 2,2,4- and 2,4,4-trimethyl hexamethylene diamine and 2,2,7,7-tetramethyl octamethylene diamine.

Triamines which may be used to make the polyamides include, but are not limited to, 1,8-diamino-4-(aminomethyl)-octane, 1,6, 11-undecanetriamine, 1,6-diamino-3-(aminomethyl)-hexane and bis(hexamethylene)diamine Dicarboxylic acids which may be used to make the polyamides include, but are not limited to, adipic acid, sebacic acid, maleic acid, fumaric acid, succinic acid, malonic acid, suberic acid, pimelic acid and glutaric acid.

Alkylene oxides which may be used to react with the polyamides include, but are not limited to, ethylene oxide, propylene oxide and 1,2-butylene oxide.

The compounds of formula (I) are included in the metal plating compositions in amounts of 0.001 g/L to 5 g/L, or such as from 0.01 g/L to 1 g/L.

One or more sources of metal ions are included in the metal plating compositions to plate metals. The one or more sources of metal ions provide metal ions which include, but are not limited to, copper, tin, nickel, gold, silver, palladium, platinum and indium. Alloys include, but are not limited to, binary and ternary alloys of the foregoing metals. Typically, metals chosen from copper, tin, nickel, gold, silver or indium are plated with the metal plating compositions. More typically, metals chosen from copper, tin, silver or indium are plated. Most typically, copper is plated.

Copper salts which may be used in the metal plating compositions include, but are not limited to, one or more of copper halides, copper sulfates, copper alkane sulfonate, copper alkanol sulfonate and copper citrate. Typically, copper sulfate, copper alkanol sulfonate or mixtures thereof are used in the plating compositions.

Tin salts which may be used in the metal plating compositions include, but are not limited to, one or more of tin sulfates, tin halides, tin alkane sulfonates such as tin methane sulfonate, tin ethane sulfonate, and tin propane sulfonate, tin aryl sulfonate such as tin phenyl sulfonate and tin toluene sulfonate, and tin alkanol sulfonate. Typically, tin sulfate or tin alkane sulfonate is used in the plating compositions.

Gold salts which may be used in the metal plating compositions include, but are not limited to, one or more of gold trichloride, gold tribromide, gold cyanide, potassium gold chloride, potassium gold cyanide, sodium gold chloride and sodium gold cyanide.

Silver salts which may be used in the metal plating compositions include, but are not limited to, one or more of silver nitrate, silver chloride, silver acetate and silver bromate. Typically, silver nitrate is used in the plating compositions.

Nickel salts which may be used in the metal plating compositions include, but are not limited to, one or more of nickel chloride, nickel acetate, nickel ammonium sulfate, and nickel sulfate.

Palladium salts which may be used in the metal plating compositions include, but are not limited to, one or more of palladium chloride, palladium nitrate, palladium potassium chloride and palladium potassium chloride.

Platinum salts which may be use include, but are not limited to, one or more of platinum tetrachloride, platinum sulfate and sodium chloroplatinate.

Indium salts which may used include, but are not limited to, one or more of indium salts of alkane sulfonic acids and aromatic sulfonic acids, such as methanesulfonic acid, ethanesulfonic acid, butane sulfonic acid, benzenesulfonic acid and toluenesulfonic acid, salts of sulfamic acid, sulfate salts, chloride and bromide salts of indium, nitrate salts, hydroxide salts, indium oxides, fluoroborate salts, indium salts of carboxylic acids, such as citric acid, acetoacetic acid, glyoxylic acid, pyruvic acid, glycolic acid, malonic acid, hydroxamic acid, iminodiacetic acid, salicylic acid, glyceric acid, succinic acid, malic acid, tartaric acid, hydroxybutyric acid, indium salts of amino acids, such as arginine, aspartic acid, asparagine, glutamic acid, glycine, glutamine, leucine, lysine, threonine, isoleucine, and valine.

Additional metals which may be included in the metal plating compositions include, but are not limited to, one or more of bismuth, cobalt, chromium and zinc. Such metals may be included with one or more of the metals described above as alloying metals. Sources of bismuth ions include, but are not limited to, one or more of bismuth ammonium citrate and bismuth phosphate. Sources of cobalt ions include, but are not limited to, one or more of cobalt ammonium sulfate, cobalt acetate, cobalt sulfate and cobalt chloride. Sources of chromium ions include, but are not limited to, one or more of chromic acetate, chromic nitrate and chromic bromide. Sources of zinc ions include, but are not limited to, one or more of zinc bromate, zinc chloride, zinc nitrate and zinc sulfate.

Binary alloys which may be plated from the metal plating compositions include, but are not limited to, alloys of tin and copper, tin and bismuth, gold and silver, indium and bismuth, indium and zinc, and gold and cobalt. Typically, alloys of tin and copper are plated.

Ternary alloys which may be plated from the metal plating compositions include, but are not limited to, alloys of tin, silver and copper, and gold, silver and copper.

In general, the metal salts are included in the plating compositions such that metal ions range in concentrations from 0.01 g/L to 200 g/L, or such as from 0.5 g/L to 150 g/L, or such as from 1 g/L to 100 g/L, or such as from 5 g/L to 50 g/L. Typically, metal salts are included in amounts such that metal ion concentrations range from 0.01 to 100 g/L, more typically from 0.1 g/L to 60 g/L.

In addition to the amides and the sources of metal ions, the metal plating compositions may include one or more conventional diluents. Typically, the metal plating compositions are aqueous; however, conventional organic diluents may be used if desired. Optional conventional plating composition additives also may be included. Such additives include, but are not limited to, one or more of brighteners, suppressors, surfactants, inorganic acids, organic acids, brightener breakdown inhibition compounds, alkali metal salts, and pH adjusting compounds. Additional additives may be included in the metal plating compositions to tailor the performance of the metal plating for a particular substrate. Such additional additives may include, but are not limited to, other levelers and compounds which affect throwing power.

Brighteners include, but are not limited to, one or more of 3-mercapto-propylsulfonic acid sodium salt, 2-mercaptoethanesulfonic acid sodium salt, bissulfopropyl disulfide (BSDS), N,N-dimethyldithiocarbamic acid (3-sulfopropyl) ester sodium salt (DPS), (O-ethyldithiocarbonato)-S-(3-sulfopropyl)-ester potassium salt (OPX), 3-[amino-iminomethyl)-thio]-1-propanesulfonic acid (UPS), 3-(2-benzthiazolylthio)-1-propanesulfonic acid sodium salt (ZPS), the thiol of bissulfopropyl disulfide (MPS), sulfur compounds such as 3-(benzthiazoyl-2-thio)-propylsulfonic acid sodium salt, 3-mercaptopropane-1-sulfonic acid sodium salt, ethylenedithiodipropylsulfonic acid sodium salt, bis-(p-sulfophenyl)-disulfide disodium salt, bis-(ω-sulfobutyl)-disulfide disodium salt, bis-(ω-sulfohydroxypropyl)-disulfide disodium salt, bis-(ω-sulfopropyl)-disulfide disodium salt, bis-(ω-sulfopropyl)-sulfide disodium salt, methyl-(ω-sulfopropyl)-disulfide sodium salt, methyl-(ω-sulfopropyl)-trisulfide disodium salt, O-ethyl-dithiocarbonic acid-S-(ω-sulfopropyl)-ester, potassium salt thioglycolic acid, thiophosphoric acid-O-ethyl-bis-(ω-sulfpropyl)-ester disodium salt, and thiophosphoric acid-tris(ω-sulfopropyl)-ester trisodium salt.

Brighteners may be added to the metal plating compositions in conventional amounts. In general, brighteners are added in amounts of 1 ppb to 1 g/L, or such as from 10 ppb to 500 ppm.

Suppressors include, but are not limited to, one or more of oxygen containing high molecular weight compounds such as carboxymethylcellulose, nonylphenolpolyglycol ether, octandiolbis-(polyalkylene glycolether), octanolpolyalkylene glycolether, oleic acidpolyglycol ester, polyethylenepropylene glycol, polyethylene glycol, polyethylene glycoldimethylether, polyoxypropylene glycol, polypropylene glycol, polyvinylalcohol, stearic acidpolyglycol ester, and stearyl alcoholpolyglycol ether. Typically poly(alkoxylated)glycols are used. Such suppressors may be included in the metal plating formulations in conventional amounts, such as from 0.01 g/L to 10 g/L, or such as from 0.5 g/l to 5 g/L.

One or more conventional surfactants may be used. Typically, surfactants include, but are not limited to, nonionic surfactants such as alkyl phenoxy polyethoxyethanols. Other suitable surfactants containing multiple oxyethylene groups also may be used. Such surfactants include compounds of polyoxyethylene polymers having from as many as 20 to 7500 repeating units. Such compounds also may perform as suppressors. Also included in the class of polymers are both block and random copolymers of polyoxyethylene (EO) and polyoxypropylene (PO). Surfactants may be added in conventional amounts, such as from 0.5 g/L to 20 g/L, or such as from 5 g/L to 10 g/L.

Conventional levelers include, but are not limited to, one or more of alkylated polyalkyleneimines and organic sulfo sulfonates. Examples of such compounds include 1-(2-hydroxyethyl)-2-imidazolidinethione (HIT), 4-mercaptopyridine, 2-mercaptothiazoline, ethylene thiourea, thiourea, 1-(2-hydroxyethyl)-2-imidazolidinethione (HIT) and alkylated polyalkyleneimines. Such levelers are included in conventional amounts. Typically, such levelers are included in amounts of 1 ppb to 1 g/L, or such as from 10 ppb to 500 ppm.

One or more inorganic and organic acids are included in the metal plating compositions to increase the solution conductivity of the matrix and also to adjust the pH of the plating composition. Inorganic acids include, but are not limited to, sulfuric acid, hydrochloric acid, nitric acid and phosphoric acid. Organic acids include, but are not limited to, alkane sulfonic acids, such a methane sulfonic acid. Acids are included in the plating compositions in conventional amounts.

Alkali metal salts which may be included in the plating compositions include, but are not limited to, sodium and potassium salts of halogens, such as chloride, fluoride and bromide. Typically chloride is used. Such alkali metal salts are used in conventional amounts.

One or more brightener breakdown inhibiting compounds may be included in the plating compositions. Brightener breakdown inhibiting compounds include any compound which is compatible with the other components of the compositions and prevents or at least inhibits the breakdown of brighteners in the plating compositions. Typically, such compounds are included in metal plating baths for electroplating with insoluble anodes. Such compounds include, but are not limited to aldehydes such as 2,3,4-trihydroxybenzaldehyde, 3-hydroxybenzaldehyde, 3,4,5-trihydroxybenzaldehyde, 2,4-dihydroxybenzaldehyde, 4-hydroxy-3-methoxy cinnamaldehyde, 3,4,5-trihydroxybenzaldehyde monohydrate, syringealdehyde, 2,5-dihydroxybenzaldehyde, 2,4,5-trihydroxybenzaldehyde, 3,5-hydroxybenzaldehyde, 3,4-dihydroxybenzaldehyde, 4-hydroxybenzaldehyde, 4-carboxybenzaldehyde, 2-chloro-4-hydroxybenzaldehyde, and 3-furanaldehyde. Other aldehydes include, but are not limited to, pyridine carboxaldehyde, benzaldehyde, naphthaldehyde, biphenyl aldehyde, anthracene aldehyde, phenanthracene aldehyde, and 2-formyl phenoxy acetic acid.

Hydroxylamines which may function as brightener breakdown inhibitors include, but are not limited to, hydroxylamine sulfate, hydroxylamine nitrate and hydroxylamine chloride. Typically, hydroxylamine sulfate or hydroxylamine nitrate are used.

Various alcohols also may be used as brightener breakdown inhibitors. Such alcohols include, but are not limited to, alkyl, alkenyl and alkynyl alcohols, unbranched and branched, as well as aromatic alcohols, non-aromatic cyclic alcohols and heterocyclic alcohols. Such alcohols include crotyl alcohol, 2-methylene-1,3-propanediol, 3-butene-1-ol, and 1,4-anhydro-erythritol. Other alcohols include naphthalene derivatives such as 1,2-dihydroxynaphthalene, 1,3-dihydroxynaphthalene, 2,3-dihydroxynaphthalene, 2,4-dihydroxynaphthalene, 2,7-dihydroxynaphthalene, 2,6-dihydroxynaphthalene, 4,5-dihydroxynaphthalene-2,7-disulfonic acid disodium salt, 6,7-dihydroxynaphthalene-2,7-disulfonic acid, 6-hydroxy-2-naphthalene sulfonic acid, 4-amino-5-hydroxy-2,7-naphthalene disulfonic acid monosodium salt, 1,5-dihydroxy-1,2,3,4-tetrahydra-naphthalene, 2,6-dihydroxynaphthalene, 1,5-dihydroxynaphthalene, 1-naphthol-3,6-disulfonic acid disodium salt hydrate, decahydro-2-naphthol, 1,2,3,4-tetrahydro-1-naphthol, 2-naphthalene methanol, 1,6-dihydroxynaphthalene, 6,7-dihydroxy-2-naphthalene sulfonic acid hemihydrate, and 4-hydroxy-1-naphthalene sulfonic acid sodium salt. Preferred aromatic alcohols include 5-methoxyresorcinol, 4-chlororesorcinol, 2-nitroresorcinol, 2-allyl phenol, 1,2,4-benzenetriol, isoeugenol, α, α, α-trifluoro-m-cresol, 4-tert-butyl catechol, 3-hydroxy-1-benzyl alcohol, 4-hydroxybenzyl alcohol, phloroglucinol dihydrate and anhydride, olivetol, and 3-chlorophenol.

Examples of other suitable alcohols include 1,2-benzenedimethanol, 1,3-benzenedimethanol, 4-aminophenol, 4-methoxyphenol, 4-ethylresorcinol, hydroquinone, chloroquinone, hydroquinone sulfonic acid potassium salt, 4-(methylthio)-benzyl alcohol, benzyl alcohol, coniferyl alcohol, 3-methoxycatechol, 4-mercapto-phenol, 4,4'-thiodiphenol, 3-methoxy phenol, phenol, cresol, and orcinol monohydrate. Other preferred compounds include, but are not limited to, 2',4',6'-trihydroxyacetophenone monohydrate, 2,5-dihydroxy-1,4-benzoquinone, and tetrahydroxy-1,4-quinonehydrate.

Heterocyclic compounds include saturated lactones or lactones having one or more double bonds. Such lactones include ascorbic acid and α-hydroxy-γ-butyrolactone. Also included are the metal salts of such lactones such as the sodium, potassium and iron salts. Examples of other heterocyclic compounds include 2-hydroxybenzofuran, 5,6-dihydro-4-hydroxy-6-methyl-2H-pyran-2-one, 2-hydroxybenzofuran, naringin hydrate, sesamol, 2,4-dihydroxy-6-methyl pyrimidine, and 1,2,4-triazolo(1,5-A)-pyrimidine.

Examples of other suitable compounds include 3-furanmethanol, 2,4,5-trihydroxy-pyrimidine, 5,6-isopropylidene ascorbic acid, and dehydroascorbic acid.

Organic acids also may function as brightener breakdown inhibitors. Such acids include, but are not limited to, one or more of 2,6-dihydroxybenzoic acid, 4-hydroxybenzoic acid resorcinol, 2,3-dihydroxybenzoic acid, 2,4-dihydroxybenzoic acid, 2,4,6-trihydroxybenzoic acid, 2,3,4-trihydroxybenzoic acid, methyl-3,4,5-trihydroxybenzoic acid, methyl-2,4-dihydroxybenzoate, 4-hydroxymandelic acid monohydrate, 3-(phenylthio)acetic acid, 4-hydroxybenzene sulfonic acid, gallic acid, 4-vinylbenzoic acid, 3,4-dihydroxy cinnamic acid, 4-methoxy cinnamic acid, 2-hydroxy cinnamic acid, phthalic acid, trans-3-furanyl acrylic acid, vinyl acetic acid, and sulfanilic acid. Also included are acid anhydrides such as phthalic anhydride.

Other compounds which may function as brightener break down inhibitors include, but are not limited to, methyl sulfoxide, methyl sulfone, tetramethylene sulfoxide, thioglycolic acid, 2 (5H) thiophenone, 1,4-dithiane, trans-1,2-dithiane, 4,5-diol, tetrahydrothiophen-3-one, 3-thiophenemethanol, 1,3,5-trithiane, 3-thiophenacetic acid, thiotetronic acid, thioctic acid, crown ethers, crown thioethers, tetrapyrids, ethane thiosulfonate, (2-sulfonatoethyl) methane sulfonate, carboxyethylmethane thiosulfonate, 2-hydroxyethylmethane thiosulfate, 1,4-butanediyl bismethane thiosulfonate, 1,2-ethanediylbismethane thiosulfonate, 1,3-propanediyl methane thiosulfonate, (3-sulfonatopropyl) methane thiosulfonate, propylmethane thiosulfonate, p-tolyldisulfoxide, p-tolyldisulfone, bis(phenylsulfonyl) sulfide, isopropyl sulfonyl chloride, 4-(chlorosulfonyl) benzoic acid, dipropyltrisulfide, dimethyltrisulfide, dimethyltetrasulfide, bis(3-triethoxysilyl) propyltetrasulfide, phenyl vinyl sulfone, 4-hydroxy-benzene sulfonic acid, 1,4,7,10,13,16-hexamethyl-1,4,7,10,13,16-hexaazacyclooctadecane, 1,4,7,10-tetra-p-tosyl-1,4,7,10-tetraazacyclododecane, and 1,4,10,13-tetraoxa-7,16-diazacyclooctadecane.

Brightener breakdown inhibitors are included in the plating compositions in amounts of 0.001 g/L to 100 g/L. Typically, such compounds are included in amounts of 0.01 g/L to 20 g/L.

The measured pH of the metal plating compositions may range from -1 to 14, or such as from −1 to 8. Typically, the pH of the plating compositions range from −1 to 5, more typically, from −1 to 3. Conventional buffering compounds may be included to control the pH of the compositions. Due to the high acid concentration used, the molar concentration of sulfuric acid is more typically 2 mol/l. Therefore according to the well known relation pH=-log [$H_2SO_4$], (compare e.g. Butler, Ionic Equilibrium, Addison-Wesley 1964, p94) the pH may be 0 to −0.3.

The metal plating compositions may be used to plate a metal or metal alloy on a substrate by any method known in the art and literature. Typically, the metal or metal alloy is plated using conventional electroplating processes with conventional apparatus. A soluble or insoluble anode may be used with the plating compositions.

Pulse plating or direct current (DC) plating or a combination of DC and pulse plating may be used. Such plating processes are known in the art. Current densities and electrode surface potentials may vary depending on the specific substrate to be plated. Generally, anode and cathode current densities may vary from 0.01 to 15 A/dm$^2$. Low speed plating ranges from 0.1 A/dm$^2$ to 3 A/dm$^2$. High speed plating ranges from 3 A/dm$^2$ and higher, typically from 3 A/dm$^2$ to 7 A/dm$^2$. Plating baths are maintained in a temperature range of from 20° C. to 110° C., or such as from 20° C. to 50° C. Plating temperatures may vary depending on the metal to be plated.

Including amides of formula (I) in metal plating compositions provide at least improved leveling performance over many conventional metal plating compositions. Such metal plating compositions may be used in metal plating in the manufacture of electrical devices such as printed wiring boards, including the plating of through-holes and vias, integrated circuits, electrical contact surfaces and connectors, electrolytic foil, silicon wafers for microchip applications, semi-conductors and semi-conductor packaging, lead frames, optoelectronics and optoelectronic packaging, and solder bumps. Additionally, the metal plating compositions may be used for metal plating decorative articles such as jewelry, furniture fittings, automobile parts, and sanitary appliances.

The following examples are provided to better illustrate the invention, but are not intended to limit the scope of the invention.

EXAMPLE 1

Adipic acid in an amount of 3 grams is placed in a thick-wall glass tube and 2.5 grams of hexamethylene diamine with 1 ml water are added into the tube. The tube is sealed under vacuum and then heated in a mineral oil bath at 180° C. to 185° C. for 2 hours and then cooled to room temperature. The resulting product is a polyamide Ethylene oxide in an amount of 24 grams is condensed at −60° C. under nitrogen in a closed glass pressure vessel. Dioxane in an amount of 25 ml is added to the cooled ethylene oxide. The polyamide in an amount of 5 grams is then is added to the mixture of ethylene oxide and dioxane at −30° C. and the vessel is closed. The suspension is stirred for 48 hours at room temperature. The vessel heated to 130° C. and maintained at 130° C. for 6 to 10 hours. After cooling to room temperature, the product is diluted with water and then filtered with charcoal at 80° C. After removing the water by evaporation, the product is vacuum dried over anhydrous calcium chloride.

The structure of the end product is determined by hydrogen NMR and IR spectroscopy. The reaction product includes a mixture of compounds having a formula:

$$H(OCH_2CH_2)_{25}\text{—}[NH\text{—}(CH_2)_6\text{—}HN(CH_2CH_2O)_{2\text{-}5}\text{—}C(O)\text{—}(CH_2)_4\text{—}C(O)]_{2\text{-}5}\text{—}NH(CH_2CH_2O)_{2\text{-}5}\text{—}(CH_2)_6\text{—}NH(CH_2CH_2O)_{25}H \quad (III)$$

EXAMPLE 2

Poly((ethylenedioxy)bis(ethylene)adipamide) is prepared as described from adipic acid and 2,2′-Ethylenedioxy-bis-ethylamine at a molar ratio of 1:1.1 at 195-250° C. and finally heated at 250° C./15mbar. The reaction liquid solidified at 145° C. to a water soluble material with mainly 10 units and molecular weights of 1050 and higher.

The ethoxylation is carried out in a steel reactor. A sample of powdered polyamide is placed into the reactor and 30-40 ml of purified dioxane is added. After closing the reactor all air is removed and replaced with argon.

Ethylene oxide is transferred into the reactor at 3° C. 6 g Poly((ethylenedioxy)bis-(ethylene)adipamide)) are reacted with ethylene oxide to an uptake of 4 g for 2 days at room temperature and then heated at 110-130° C. for 10 hours. 10 g oil is obtained after removing the solvent. The oil is dissolved in water treated with active charcoal and filtrated. The product includes a mixture of compounds having a formula:

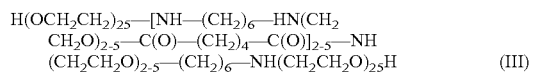

EXAMPLE 3

Poly(bis(hexamethylene)amine adipamide) is prepared as described from adipic acid and Bis(hexamethylene)triamine at a molar ratio of 1:1.4 at 200-250° C. and finally heated at 250° C./15 mbar. A sulfuric acid soluble solid is obtained.

The ethoxylation is carried out as described above. 7 g Poly((ethylenedioxy)bis-(ethylene)adipamide)) are reacted to an uptake of 19 g ethylene oxide for 2 days at room temperature and then heated at 110-130° C. for 12 hours. 26 g of product are obtained. The product is dissolved in water, treated with active charcoal and filtrated. The reaction product includes a mixture having a formula:

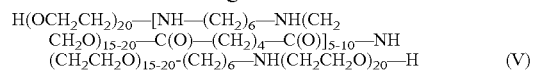

EXAMPLE 4

A stock solution of an aqueous copper plating composition is prepared with the following concentrations of materials: 80 g/L copper sulfate pentahydrate, 225 g/L sulfuric acid and hydrochloric acid in sufficient amount to provide 60 mg/L chloride ions. Aliquots are taken from the stock solution to make twelve 1400 ml solutions containing a brightener and a suppressor. Ten of the solutions also include mixtures of polyalkoxylated polyamides from the Examples above. The table below discloses the ten formulations.

TABLE 1

| SOLUTION | Alkoxylated Amide | Brightener | Suppressor |
|---|---|---|---|
| 1 | Example 1 | ZPS | Carboxymethylcellulose |
| 2 | Example 2 | DPS | Copolymer of EO/PO |
| 3 | Example 3 | BSDS | Polyethylene glycol |
| 4 | Example 1 | OPX | Polyoxytheylene polymer 100 repeating units |
| 5 | Example 2 | UPS | Polyethylene glycol dimethyl ether |
| 6 | Example 3 | 2-mercapto-ethanesulfonic acid | Polyethylene glycol |
| 7 | Example 1 | BSDS | Copolymer of EO/PO |
| 8 | Example 2 | UPS | Polyethylenepropylene glycol |
| 9 | Example 3 | 3-mercaptopropane-1-sulfonic acid | Polyvinyl alcohol |
| 10 | Example 1 | ZPS | Polyvinyl alcohol |
| 11 | 0 (control) | DPS | Copolymer of EO/PO |
| 12 | 0 (control) | BSDS | Polyethylene glycol |

The polyalkoxylated polyamide mixtures are included in the solutions in amounts of 0.1 g/L. The brighteners are included in amounts of 500 ppm and the suppressors are included in amounts of 0.5 g/L. Each 1400 ml aliquot of the aqueous copper plating composition is then added to a conventional Haring cell. Phosphorized copper anodes are immersed in either side of the Haring cell and are electrically connected to a conventional rectifier. A double sided copper clad panel (0.16 cm thick, 5 cm×15 cm) is then immersed in the center of each Haring cell, and the panels are then plated for 50 minutes at 3 A/dm² with air agitation. Electroplating is done at room temperature.

After 50 minutes each panel is removed, immersed in an anti-tarnish solution of 20% by volume aqueous Antitarnish™ 7130 (obtainable from Rohm and Haas Electronic Materials, Marlborough, Mass.) and air-dried with a blower. The copper plating on the panels which were plated in the solutions with the polyalkoxylated amide mixtures are expected to be bright and smooth. Additionally, no observable defects on the panels, such as nodules, step plating and fingerprints are expected. In contrast, the panels which were plated with the solutions without the polyalkoxylated amide mixtures are expected to be hazy.

EXAMPLE 5

A stock solution of a copper plating composition is made as described in Example 4 above. Twelve 1400 ml solutions are made as shown in Table 1 above. The solutions are added to twelve separate Haring cells. Phosphorized copper anodes are immersed in either side of each Haring cell and the cells are electrically connected to a conventional rectifier.

A double sided copper clad panel (0.16 cm thick, 5 cm×15 cm) with multiple 0.3 mm diameter through-holes are placed in the center of each Haring cell. Each panel is electroplated for 50 minutes at 3 A/dm$^2$ with air agitation. Electroplating is done at room temperature. After electroplating is completed the panels are removed from the Haring cells and cross-sectioned to inspect the copper plating quality of the through-holes. The through-holes are inspected using an optical microscope at 200× magnification. The through-holes plated with the solutions containing the polyalkoxylated polyamide mixtures are expected to show improved leveler performance with smoother and more uniform copper layers than the through-holes plated with the solutions without the polyalkoxylated polyamide mixtures.

EXAMPLE 6

A copper electroplating stock solution as described in Example 4 above is prepared. Fourteen 1400 ml aliquots are taken from the stock solution to make up 14 separate test solutions. The composition of each test solution is disclosed in Table 2 below.

TABLE 2

| SAMPLES | Alkoxylated Amide | Brightener | Suppressor |
| --- | --- | --- | --- |
| 1-4 | Example 1 | BSDS | Copolymer of EO/PO |
| 5-8 | Example 2 | DPS | Polyethylene glycol |
| 9-12 | Example 3 | OPX | Polyvinyl alcohol |
| 13 | 0 (Control) | DPS | Polyethylene glycol |
| 14 | 0 (Control) | BSDS | Copolymer of EO/PO |

Each sample includes the brighteners in amounts of 10 mg/L and the suppressors in amounts of 1.5 g/L. The amount of the polyalkoxylated polyamide mixture in each solution is varied. Samples 1-4 include the polyalkoxylated polyamide mixture from Example 1 in amounts of 0.001 g/L, 0.01 g/l, 0.5 g/L and 1 g/L, respectively. Samples 5-8 include the polyalkoxylated polyamide mixture from Example 2 in amounts of 0.005 g/L, 0.01 g/L, 0.5 g/L and 1 g/L, respectively. Samples 9-12 include the polyalkoxylated polyamide mixture from Example 3 in amounts of 0.05 g/L, 0.25 g/L, 0.5 g/L and 1 g/L, respectively. Samples 13 and 14 are control samples and contain no polyalkoxylated polyamides.

Each sample is placed in a Haring cell and phosphorized copper anodes are immersed in either side of each Haring cell. The cells are electrically connected to a conventional rectifier. A double sided copper clad panel (0.16 cm thick, 5 cm×15 cm) with multiple 0.3 mm diameter through-holes are placed in the center of each Haring cell. Each panel is electroplated for 50 minutes at 3 A/dm$^2$ with air agitation. Electroplating is done at room temperature. After electroplating is completed the panels are removed from the Haring cells and cross-sectioned to inspect the thickness of the copper plating of the through-holes. The through-holes are inspected using an optical microscope at 200× magnification. The through-holes plated with the samples containing the polyalkoxylated polyamide mixtures are expected to show improved throwing power by having thicker copper layers than the samples without the polyalkoxylated polyamides.

EXAMPLE 7

An aqueous tin plating composition which includes 20 g/L of tin ions from tin sulfate, 40 g/L of sulfuric acid, 0.5 g/L of an ethylene oxide/propylene oxide copolymer having an average molecular weight of 2200, 10 ml/L of sulfated alkyl ethoxylate (TRITON™ QS-15) and 0.1 g/L of the polyalkoxylated polyamide mixture of Example 1 is placed in a Haring cell as described in Example 4. The pH of the tin plating composition is less than 1 and the temperature is 30° C. The substrate is a bronze coupon 5 cm×15 cm. Tin electroplating is done at 3 A/dm$^2$ for 50 minutes. The tin layer is expected to be smooth and free of any observable defects.

EXAMPLE 8

An aqueous tin/copper alloy plating composition which includes 30 g/L of tin ions from tin sulfate, 20 g/L of copper ions from copper sulfate pentahydrate, 50 g/L of sulfuric acid, 1 g/L of an ethylene oxide/propylene oxide copolymer having an average molecular weight of 3000, 20 ml/L of a polyethoxylated amine (JEFFAMINE™ T-403, available from Huntsman Corporation) and 0.1 g/L of the polyalkoxylated polyamide mixture of Example 2 is placed in a Haring cell as described in Example 4. The pH of the tin/copper plating composition is less than 1 and the temperature is 30° C. The substrate is a bronze coupon 5 cm×15 cm. Tin/copper electroplating is done at 4 A/dm$^2$ for 35 minutes. The tin/copper alloy layer is expected to be smooth and free of any observable defects.

EXAMPLE 9

An aqueous tin/bismuth alloy plating composition which includes 25 g/l of tin ions from tin sulfate, 10 g/L of bismuth ions from bismuth trichloride, 90 g/L of sulfuric acid, 2 g/L of an ethylene oxide/propylene oxide copolymer with an average molecular weight of 2500, 10 ml/L of sulfated alkyl ethoxylate (TRITON™ QS-15) and 0.1 g/L of the polyalkoxylated polyamide mixture of Example 3 is placed in a Haring cell as described in Example 4. The pH of the tin/bismuth composition is less than 1 and the temperature is at 30° C. The substrate is a bronze coupon 5 cm×15 cm. Tin/bismuth electroplating is done at 2 A/dm$^2$ for 60 minutes. The tin/bismuth alloy layer is expected to be smooth and free of any observable defects.

EXAMPLE 10

An aqueous tin/indium alloy plating composition which includes 35 g/L of tin ions from tin sulfate, 5 g/L of indium ions from indium trichloride, 50 g/L of sulfuric acid, 1 g/L of an ethylene oxide/propylene oxide copolymer with an average molecular weight of 5000, 10 ml/L of a sulfated alkyl ethoxylate (TRITON™ QS-15), and 0.1 g/L of the polyalkoxylated polyamide mixture of Example 1 is placed in a Haring cell as described in Example 4. The pH of the tin/indium composition is less than 1 and the temperature is at 30° C. The substrate is a bronze coupon 5 cm×15 cm. Tin/indium electroplating is done at 1 A/dm$^2$ for 100 minutes. The tin/indium alloy layer is expected to be smooth and free of any observable defects.

EXAMPLE 11

An aqueous tin/silver/copper alloy plating composition which includes 40 g/L tin ions from tin methane sulfonate, 1 g/L silver ions from silver methane sulfonate, 1 g/L copper from copper methane sulfonate, 90 g/L methane sulfonic acid, 2 g/L ethoxylated bis phenol, 4 g/L 1-allyl-2-thiourea and 0.1 g/L of the polyalkoxylated polyamide mixture of Example 1 is placed in a Haring cell as described in Example 4. The pH of the tin/silver/copper composition is 1 and the temperature is at 30° C. The substrate is a bonze coupon 5 cm×15 cm. Tin/silver/copper electroplating is done at 2 A/dm² for 100 minutes. The tin/silver/copper alloy layer is expected to be smooth and free of any observable defects.

EXAMPLE 12

A series of experiments was performed to compare the effect of the leveler component on the throwing power of deposits plated from a copper plating bath. Throwing power is defined as the ratio of average thickness of the plated copper deposit inside the through hole compared to the average thickness of the plated copper on the surface of the panel. This ratio is then expressed as a percentage. Generally, 100% throwing power is desirable, but not always able to be achieved in practice.

In each case below an individual leveler (or, in some cases, no leveler) was added to a copper plating bath, a panel was then electroplated, the panel was then processed, and the thickness of the electroplated copper deposit was then measured both on the surface of the panel as well as in the center of the through holes drilled into the panel. After the plating experiment, the solution was discarded and fresh stock solution was used in the next experiment.

A stock solution of an aqueous copper plating bath was prepared with the following concentration of inorganic materials: 75 g/L copper sulfate pentahydrate, 190 g/L sulfuric acid, and hydrochloric acid in sufficient amount to provide 60 mg/L chloride ions. 3 mL/L of Rohm and Haas Electronic Materials' Copper Gleam™ ST-901A additive (brightener) and 1.5 g/L of a poly(alkoxylated)glycol (suppressor) were added to the stock solution. 1500 mL of this solution was then added to a Haring cell. Phosphorized copper slabs were immersed at either side of the Haring cell, and were used as anodes during the plating cycle. A double sided copper clad panel (1.6 mm thick, 5 cm×10 cm plating area) was placed in the center of the Haring cell, and served as the cathode during the plating cycle. Air agitation was used throughout the plating experiment. Through holes have been drilled into the panel, and the panel was previously processed such that a thin, but adherent, layer of copper (20-25 mm) was chemically deposited onto the entire exposed surface of the panel, including the through holes. An amount of leveler or no leveler was then added to the solution in the Haring cell. Copper was then electroplated at a current density of 3 A/dm² for 50 minutes. The panel was then rinsed in deionized water. An area of the board was then processed such that the thickness of the copper plated on the surface and in the center of the through holes (0.32 mm diameter) was measured. From these measurements, the throwing power of the deposit was generated, and is shown in Table 3 below. Higher throwing power measurements are more desirable.

TABLE 3

| Leveler Structure | Concentration in bath, g/L | Throwing Power, % |
| --- | --- | --- |
| No leveler | 0 | 58.6 |
| III | 0.005 | 88.7 |
| IV | 0.001 | 79.0 |
| IV | 0.025 | 82.9 |
| V | 0.01 | 87.7 |
| V | 0.005 | 87.2 |
| V | 0.010 | 75.9 |
| V | 0.025 | 84.4 |
| V | 0.050 | 84.7 |

In all cases above, the presence of these levelers shows an improvement in throwing power compared to plating baths that contained no leveler.

What is claimed is:

1. A method comprising:
   a) providing a composition comprising one or more sources of metal ions and one or more compounds having a formula:

$$R_1\text{-}A\text{-}R_3\text{-}A\text{-}[C(O)\text{—}R_5\text{—}C(O)\text{-}A\text{-}R_3\text{-}A]_n\text{-}R_2 \quad (I)$$

where A is —NH—; or —NH—$R_6$—;
   $R_1$ is random, alternating or block —(CHR$_9$CHR$_{10}$O)$_p$—H, where
   $R_9$ and $R_{10}$ are the same or different and are —H, —CH$_3$, or —CH$_2$CH$_3$ and
   p is an integer from 1 to 50;
   $R_2$ is random, alternating or block —(CHR$_9$CHR$_{10}$O)$_p$—H; or —C(O)—$R_5$—C(O)OH;
   $R_3$ is —(CH$_2$)$_r$—NR$_4$—(CH$_2$)$_r$—; —(CH$_2$)$_r$—(OC$_2$H$_4$)—O—(CH$_2$)$_r$—(CH$_2$)$_r$— and
   r is an integer from 1 to 8; $R_4$ is random, alternating or block —(CHR$_9$CHR$_{10}$O)$_p$—;
   $R_5$ is —(CH$_2$)$_q$— where q is an integer from 1 to 8;
   $R_6$ is random, alternating or block —(CHR$_9$CHR$_{10}$O)$_p$—; and n is an integer of 1 to 10;
   b) contacting a substrate with the composition; and
   c) electroplating the substrate with a metal.

2. The method of claim 1, wherein the one or more sources of metal ions provide metal ions comprising copper, tin, nickel, gold, silver, palladium, platinum, indium or mixtures thereof.

3. The method of claim 2, wherein the metal ions are copper.

4. The method of claim 1, wherein the substrate is an electrical device or a decorative article.

5. The method of claim 4, wherein the electrical device is a printed wiring board.

* * * * *